(12) United States Patent
Park et al.

(10) Patent No.: US 6,445,443 B1
(45) Date of Patent: Sep. 3, 2002

(54) LITHOGRAPHY SYSTEM INCLUDING MECHANISM FOR SETTING OPTIMAL PROCESS PARAMETERS AND METHOD OF OPERATING THE SAME

(75) Inventors: Chan-hoon Park, Seoul; Hee-sun Chae, Suwon, both of (KR)

(73) Assignee: Samsung Electronics Co., Ltd., Suwon (KR)

(*) Notice: Subject to any disclaimer, the term of this patent is extended or adjusted under 35 U.S.C. 154(b) by 201 days.

(21) Appl. No.: 09/606,156

(22) Filed: Jun. 29, 2000

(30) Foreign Application Priority Data

Jul. 5, 1999 (KR) .............................. 99-26854

(51) Int. Cl.[7] ........................... G03B 27/32; G03D 5/00
(52) U.S. Cl. ............................ 355/77; 355/27; 396/611
(58) Field of Search ..................... 355/27–30, 53, 355/77; 396/571, 578, 611; 430/311; 118/52

(56) References Cited

U.S. PATENT DOCUMENTS 5,968,691 A * 10/1999 Yoshioka et al. ............ 430/30
6,037,793 A * 3/2000 Miyazawa et al. .......... 324/760
6,266,125 B1 * 7/2001 Fukuda et al. ................ 355/27

FOREIGN PATENT DOCUMENTS

| JP | 10-305256 | 11/1998 |
| KR | 1998-036947 | 8/1998 |

* cited by examiner

Primary Examiner—Russell Adams
Assistant Examiner—Hung Henry Nguyen
(74) Attorney, Agent, or Firm—Volentine Francos, PLLC

(57) ABSTRACT

A lithography system includes a spinner, a first controller, a stepper and a second controller. The spinner coats a photoresist film on a semiconductor substrate. The first controller sets a first optimal process parameter according to external information regarding the semiconductor wafer and controls the spinner according to the first optimal process parameter, when the semiconductor wafer is loaded into the spinner. The stepper exposes the semiconductor wafer, which is coated with the photoresist film, to light of a predetermined wavelength. The second controller sets a second optimal process parameter according to the external information regarding the semiconductor wafer and controls the stepper according to the second optimal process parameter, when the semiconductor wafer coated with the photoresist film is loaded into the stepper.

9 Claims, 3 Drawing Sheets

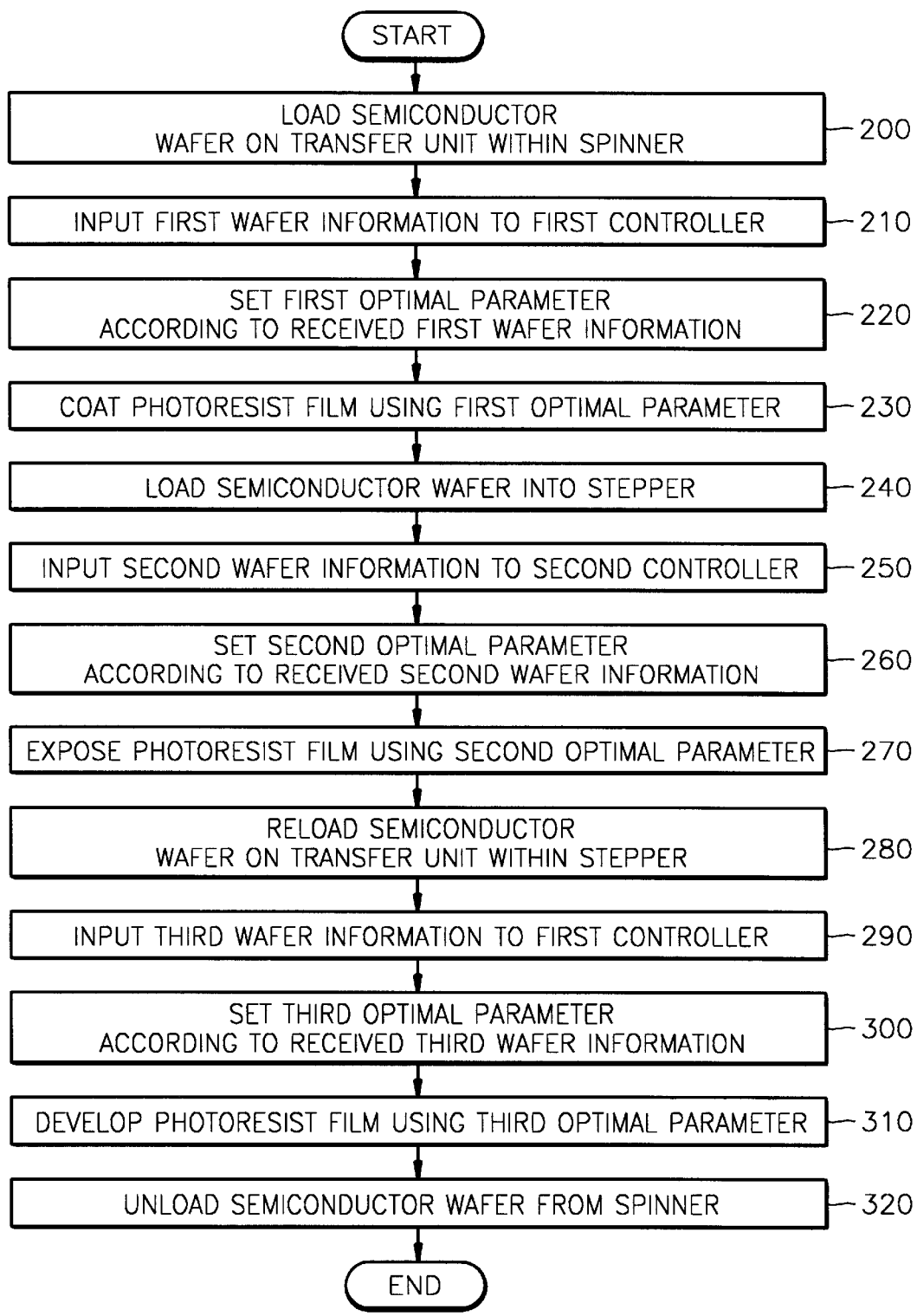

ly high precision and optimal performance capabilities are needed...

LITHOGRAPHY SYSTEM INCLUDING MECHANISM FOR SETTING OPTIMAL PROCESS PARAMETERS AND METHOD OF OPERATING THE SAME

BACKGROUND OF THE INVENTION

1. Field of the Invention

The present invention relates to a semiconductor fabrication system and to a method of operating the same, and more particularly, the present invention relates to a lithography system which has a mechanism for setting optimal process parameters and to a method of operating the same.

2. Description of the Related Art

As the integration level of semiconductor devices increases, high precision and optimal performance capabilities become more important in the fabrication of such devices. In particular, a lithography process which is used to form a fine pattern on a semiconductor substrate has become especially important. In order to obtain ultra fine and ultra dense patterns, a 248 nm-wavelength optical source is used as the optical source in current lithography systems, as opposed to the more conventional 365 nm-wavelength optical source. However, the use of such a short wavelength optical source is often accompanied by a degraded reliability of the lithography process.

Generally, a lithography system includes a spinner and a stepper. The spinner includes a coating unit for coating a mask film, that is, a photoresist film, on a semiconductor substrate, a baking unit for baking the coating of photoresist film, a cooling unit for reducing the temperature of the photoresist film, and a developing unit for developing the photoresist film. The stepper performs an exposure process using light having a predetermined wavelength. The process parameters for the stepper and each of the unit devices in the spinner are determined by controllers connected thereto. The controllers only output simple information such as the point in time when a semiconductor wafer is loaded into a lithography system, and uniformly determine the process parameters for the stepper and each of the unit devices in the spinner. That is, a uniform process parameter is applied regardless of the characteristics of each semiconductor wafer, which increases the probability that failure may occur in the processing of each unit.

For example, in conventional systems, a uniform process parameter may be applied to each unit of the spinner despite the fact that optimum time and temperature parameters for a baking process can vary with a stacked structure, and as a result errors can be generated in the process.

SUMMARY OF THE INVENTION

An object of the present invention is to provide a lithography system which includes a mechanism for setting an optimal process parameter according to a previous process applied to each semiconductor wafer.

Another object of the present invention is to provide a method of operating a lithography system by setting an optimal process parameter according to a previous process applied to each semiconductor wafer.

To achieve the first object, the present invention provides a lithography system including a spinner, a first controller, a stepper and a second controller. The spinner coats a photoresist film on a semiconductor substrate. When the wafer is loaded into the spinner, the first controller sets a first optimal process parameter according to external information denoting characteristics of the semiconductor wafer and controls the spinner according to the first optimal process parameter. The stepper exposes the semiconductor wafer, which is coated with a photoresist film, to light of a predetermined wavelength. When the semiconductor wafer coated with the photoresist film is loaded into the stepper, the second controller sets a second optimal process parameter according to the external information denoting characteristics of the semiconductor wafer and controls the stepper according to the second optimal process parameter.

Preferably, each of the first and second controllers includes a wafer information reading unit for receiving and reading the external information denoting characteristics of the semiconductor wafer from a database, an optimal process parameter setting unit for determining an optimal process parameter by comparing and matching data of a pre-stored optimal process parameter table to information read by the wafer information reading unit; and a control command generation unit for generating a control command to perform a process in accordance with the optimal process parameter determined by the optimal process parameter setting unit.

The spinner can include a baking unit for baking the photoresist film to cure the same, and a cooling unit for cooling the photoresist film. In this case, the process parameter, which is set by the first controller, includes a baking temperature and a baking time for the baking unit, and a cooling temperature and a cooling time for the cooling unit.

The spinner can further include a developing unit for removing a portion of the photoresist film from the semiconductor wafer which has been exposed by the stepper. In this case, the process parameter, which is set by the first controller, also includes a developing time for the developing unit.

The process parameter which is set by the second controller may include an exposure time, a focus setting, a number of images, and an overlay correction value for the stepper.

To achieve the second object, the present invention provides a method of operating a lithography system which includes a spinner for coating, baking, cooling and developing a photoresist film, a stepper for exposing the photoresist film, and first and second controllers for respectively controlling the spinner and the stepper. In the method, first wafer information is applied to the first controller when a semiconductor wafer is loaded on a transfer unit within the spinner. A first optimal process parameter is set within the spinner according to the received first wafer information. Coating, baking and cooling the photoresist film are performed within the spinner in accordance with the first process parameter. Second wafer information is applied to the second controller when the semiconductor wafer is loaded into the stepper. A second optimal process parameter is set within the stepper according to the received second wafer information. The photoresist film is exposed to light within the stepper in accordance with the second process parameter. Third wafer information is applied to the first controller when the semiconductor wafer, which has been subjected to the exposure process, is reloaded into the spinner. A third optimal process parameter is set within the spinner according to the received third wafer information. The photoresist film is developed within the spinner in accordance with the third process parameter.

Here, the first process parameter can include a baking temperature and baking time for the baking within spinner, and a cooling temperature and a cooling time for the cooling within the spinner. The second process parameter can include an exposure time, a focus setting, a number of images, and an overlay correction value for the stepper. The third process parameter can include a developing time for the developing process in the spinner.

In accordance with the lithography system and the operating method thereof of the present invention, the first and second controllers, which respectively control the spinner and the stepper of the lithography system, determine optimal process parameters that are the most suitable for each semiconductor wafer according to received wafer information. Also, the controllers control the spinner and the stepper so that a process is realized in accordance with the process parameters, whereby a lithography process can be optimally performed.

BRIEF DESCRIPTION OF THE DRAWINGS

The above objectives and advantages of the present invention will become more apparent the detailed description that follows with reference to the accompanying drawings, in which:

FIG. 3 is a flowchart illustrating a method of operating a lithography system according to the present invention.

DESCRIPTION OF THE PREFERRED EMBODIMENT

Figure 1:
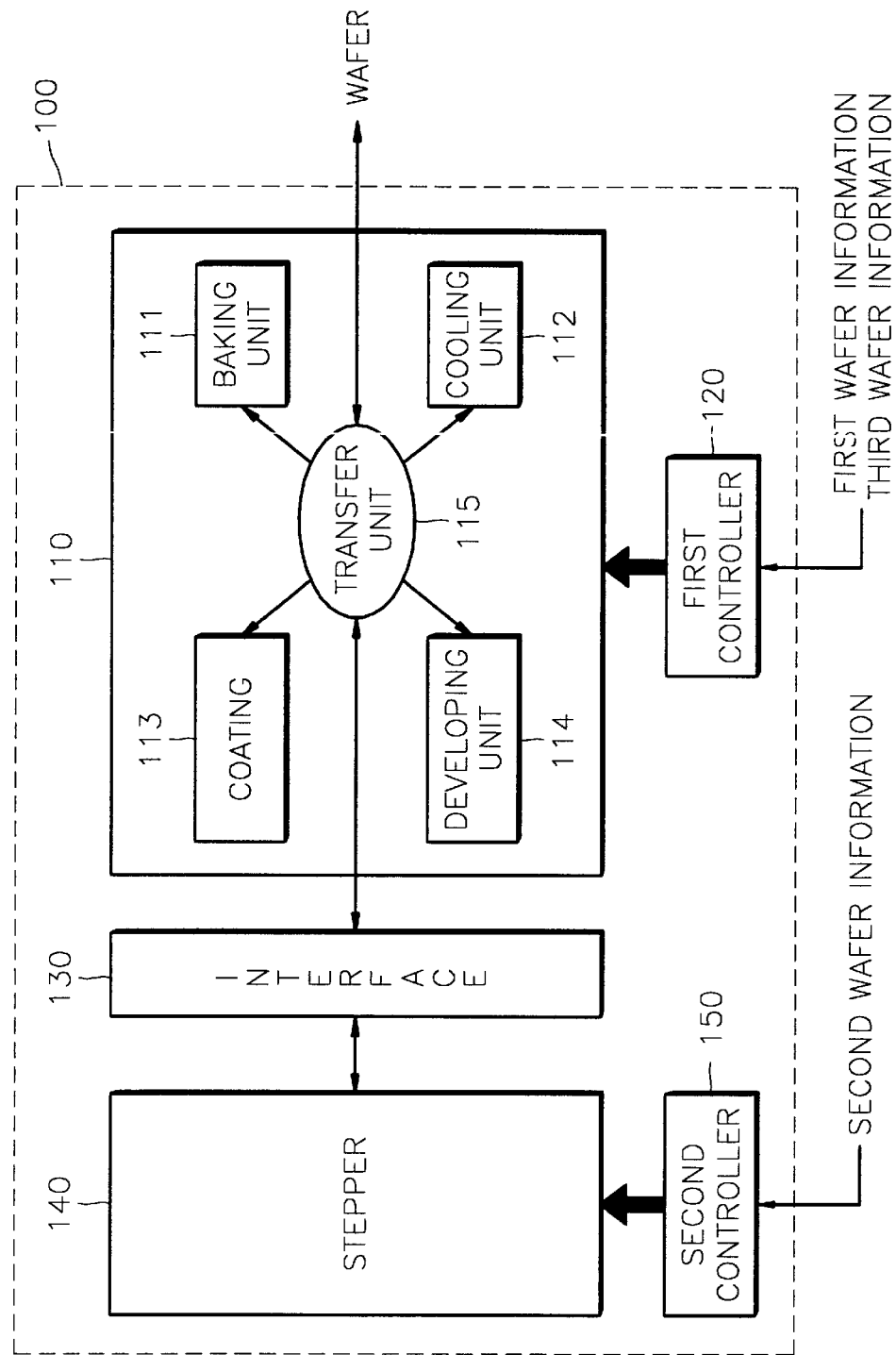
FIG. 1 is a block diagram illustrating a lithography system according to the present invention.

Referring to FIG. 1, a lithography system 100 according to the present invention includes a spinner 110, a first controller 120, an interface 130, a stepper 140, and a second controller 150. The spinner 110 includes a coating unit 113 for coating a photoresist film on a semiconductor wafer, a baking unit 111 for baking the coated photoresist film, a cooling unit 112 for cooling a heated photoresist film, a developing unit 114 for developing an exposed photoresist film, and a transfer unit 115 for transferring the semiconductor wafer within the spinner 110. The spinner 110 can further include a hexamethyldisilane (HMDS) spraying unit (not shown) for spraying HMDS onto the semiconductor wafer to increase the adhesiveness of the photoresist film.

The stepper 140 includes an optical source for emitting light of a predetermined wavelength and several lens systems which perform an exposure process. That is, the stepper 140 irradiates light onto the photoresist film using a mask having a predetermined pattern in order to cause a chemical change in those portions of the photoresist film which have been exposed to light.

Figure 2:
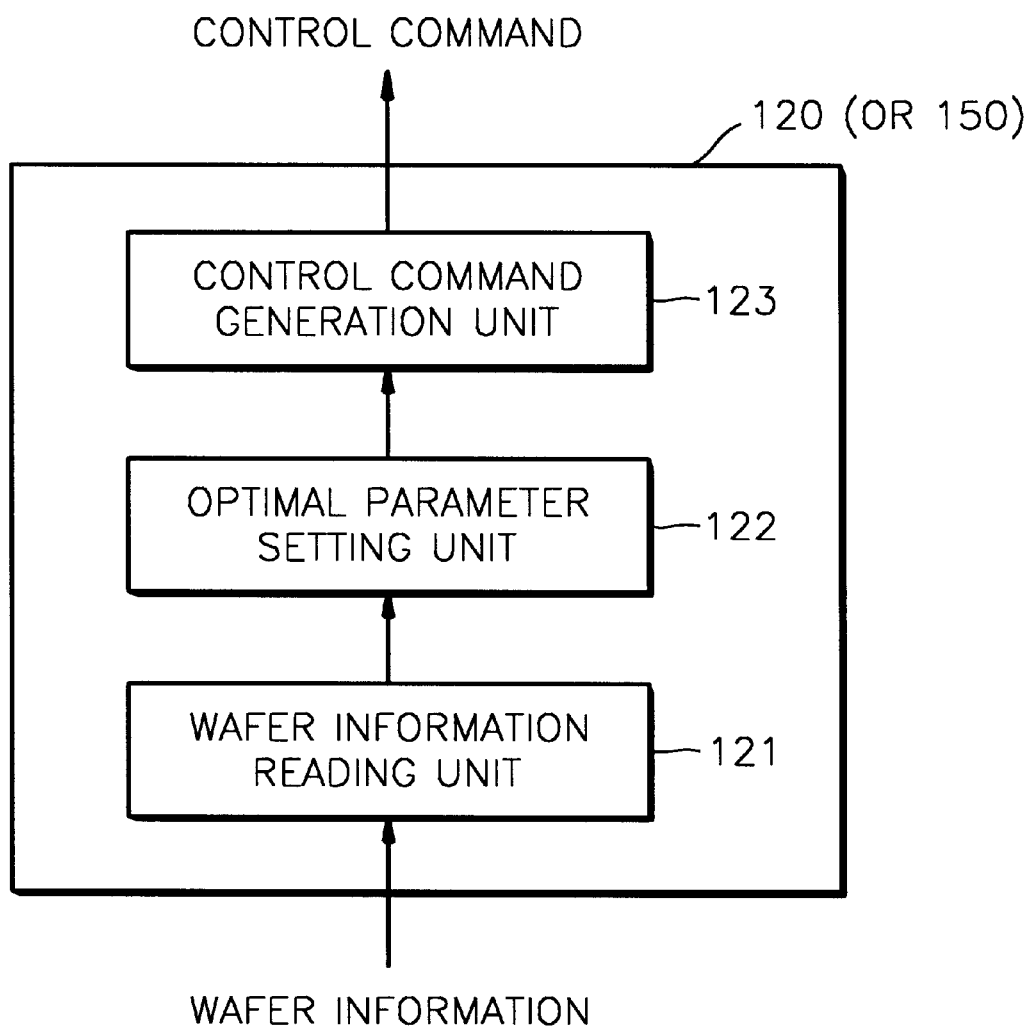
FIG. 2 is a block diagram illustrating an internal configuration of the first and/or second controller of FIG. 1.

As shown in FIG. 2, the first controller 120 and/or second controller 150 includes a wafer information reading unit 121, an optimal process parameter setting unit 122, and a control command generation unit 123.

The wafer information reading unit 121 reads received wafer information. The wafer information typically can be a wafer process history, and can include various characteristics of a semiconductor wafer. The wafer information can be input by a user or automatically received as a semiconductor wafer is loaded into the spinner 110 or the stepper 140.

The optimal process parameter setting unit 122 receives the data read by the wafer information reading unit 121 and compares and matches the data to a pre-set optimal process parameter table stored in advance within the optimal process parameter setting unit 122, thereby determining an optimal process parameter. Here, the pre-stored optimal process parameter table contains data relating numerous (e.g., hundreds to thousands) optimal process parameters to the characteristics of a semiconductor wafer and a previous process. The data contained in the optimal process parameter table can be derived according to the configuration of the lithography system and by obtaining results from simulations and/or experiments. The optimal process parameter, which is determined by the optimal process parameter setting unit 122, can include several process parameters. For example, in the case of the first controller 120 for controlling the spinner 110, the optimal process parameter can include a heating temperature and time for the baking unit 111, a cooling temperature and time for the cooling unit 112, a spin rate for the coating unit 113, a developing time for the developing unit 114, and a robot moving speed for the transfer unit 115. In this embodiment, the robot moving speed in the transfer unit 115 is determined so that the process restriction time of the spinner 110 is identical to that of the stepper 140. In the case of the second controller 150 for controlling the stepper 140, the optimal process parameter can include an exposure time, a focus setting, a number of images, and an overlay correction value.

The control command generation unit 123 generates a control command having settings such that a process is performed in the spinner 110 or stepper 140 in accordance with the optimal process parameter which is determined by the optimal process parameter setting unit 122. That is, the control command is input to unit control devices in the spinner 110 or stepper 140. In this way, when the unit control devices receive the control command, they perform unit processes according to the optimal process parameter.

FIG. 3 is a flowchart illustrating a method of operating a lithography system according to the present invention. Referring also to FIGS. 1 and 2, at step 200, a semiconductor wafer is loaded on the transfer unit 115 within the spinner 110. Then, upon loading of the semiconductor wafer into the spinner 110, first wafer information is input to the first controller 120 at step 210. As described above, the first wafer information can include a wafer process history and various characteristics of the semiconductor wafer. The first wafer information can be input by a user, or automatically supplied from a database as the semiconductor wafer is loaded into the spinner 110.

At step 220, the first controller 120 sets a first optimal process parameter within the spinner 110 according to the received first wafer information. That is, the first wafer information received by the first controller 120 is read by the wafer information reading unit 121 within the first controller 120. The read results are input to the optimal process parameter setting unit 122 from the reading unit 121. The optimal process parameter setting unit 122 determines a first optimal process parameter associated with the characteristics of the semiconductor wafer and the process history thereof by comparing and relating the read results received from the reading unit 121 with a pre-stored optimal process parameter table. The thus determined first optimal process parameter is input to the control command generation unit 123, and the control command generation unit 123 sends a control command to the spinner 120. In this exemplary embodiment, the first optimal process parameter includes the heating temperature and time for the baking unit 111, the cooling temperature and time for the cooling unit 112, the spin rate for the coating unit 113, and the robot moving speed for the transfer unit 115. Accordingly, at a next step 230, the spinner 110, which has received a control command including settings corresponding to the first optimal process parameter, coats and bakes a photoresist film according to the received control command.

Next, at step 240, the semiconductor wafer is loaded into the stepper 140 via the interface 130. At step 250, upon loading of the semiconductor wafer into the stepper 140, second wafer information is input to the second controller 150. Here, the second wafer information includes the wafer process history of the spinner 110 as well as the first wafer information. The second wafer information can be input by a user, or automatically received from a database as the semiconductor wafer is loaded into the stepper 140.

At step 260, the second controller 150 sets a second optimal process parameter within the stepper 140 according to the received second wafer information. That is, the second wafer information received by the second controller 150 is read by the wafer information reading unit 121 within the second controller 150. The read results are input to the optimal process parameter setting unit 122 from the reading unit 121. The optimal process parameter setting unit 122 determines a second optimal process parameter associated with the characteristics of the semiconductor wafer and the process history thereof, by comparing and relating the read results received from the reading unit 121 with a pre-stored optimal process parameter table. The determined second optimal process parameter is input to the control command generation unit 123, and the control command generation unit 123 sends a control command to the stepper 140. In this exemplary embodiment, the second optimal process parameter includes settings of an exposure time, a focus setting, a number of images, and an overlay correction value. Accordingly, at step 270, the stepper 140, which receives a control command including settings for achieving the second optimal process parameter, exposes the photoresist film on the semiconductor wafer according to the received control command.

Upon conclusion of the exposure process, at step 280, the semiconductor wafer is reloaded onto the transfer unit 115 within the spinner 110 via the interface 130. Then, at step 290, third wafer information is input to the first controller 120. Here, the third wafer information can include the exposure process history of the stepper 140 as well as the first and second wafer information. The third wafer information can be input by a user, or automatically received from a database as the semiconductor wafer is loaded into the spinner 110.

At step 300, when the third wafer information is input to the first controller 120, the first controller 120 sets a third optimal process parameter within the spinner 110 according to the received third wafer information. That is, the third wafer information received by the first controller 120 is read by the wafer information reading unit 121 within the first controller 120. The read results are input to the optimal process parameter setting unit 122 from the reading unit 121. The optimal process parameter setting unit 122 determines a third optimal process parameter associated with the characteristics of the semiconductor wafer and the process history thereof, by comparing and relating the read results received from the reading unit 121 with a pre-stored optimal process parameter table. The determined third optimal process parameter is input to the control command generation unit 123, and the control command generation unit 123 sends a control command to the developing unit 114 in the spinner 120. In this exemplary embodiment, the third optimal process parameter includes settings as to a developer and developing time to be employed in the developing unit 114. Accordingly, at step 300, the developing unit 114, which receives a control command including settings for achieving the third optimal process parameter, develops the photoresist film according to the received control command.

After the series of processes described above are performed, at step 320, the semiconductor wafer is unloaded from the spinner 110.

What is claimed is:

1. A method of operating a lithography system, the lithography system including a spinner which coats, bakes, cools and develops a photoresist film, a stepper which exposes the photoresist film, and first and second controllers which respectively control the spinner and the stepper, said method comprising:

applying first wafer information denoting characteristics of a semiconductor wafer to the first controller when the semiconductor wafer is loaded on a transfer unit within the spinner;

setting a first optimal process parameter within the spinner according to the first wafer information applied to the first controller;

coating, baking and cooling the photoresist film within the spinner in accordance with the first process parameter;

applying second wafer information denoting characteristics of the semiconductor wafer to the second controller when the semiconductor wafer is loaded into the stepper;

setting a second optimal process parameter within the stepper according to the second wafer information applied to the second controller;

exposing the photoresist film to light within the spinner in accordance with the second process parameter;

reloading the semiconductor wafer into the spinner;

applying third wafer information denoting characteristics of the semiconductor wafer to the first controller when the semiconductor wafer is reloaded into the spinner;

setting a third optimal process parameter within the spinner according to the received third wafer information; and developing the photoresist film within the spinner in accordance with the third process parameter.

2. The method of claim 1, wherein the first process parameter includes a baking temperature and a baking time for the spinner, and a cooling temperature and a cooling time for the spinner.

3. The method of claim 1, wherein the second process parameter includes an exposure time, a focus setting, a number of images, and an overlay correction value for the stepper.

4. The method of claim 1, wherein the third process parameter includes a developing time for a developing process for the spinner.

5. The method of claim 1, wherein said setting a first optimal process parameter comprises:

reading the first wafer information;

determining a first optimal process parameter by comparing and relating the read first wafer information to data of a pre-stored optimal process parameter table; and generating a control command and sending the control command to the spinner so that the spinner performs a process in accordance with the first optimal process parameter.

6. The method of claim 1, wherein said setting a second optimal process parameter comprises:

reading the second wafer information;

determining a second optimal process parameter by comparing and relating the read second wafer information to data of a pre-stored optimal process parameter table; and generating a control command and sending the control command to the stepper so that the stepper performs a process in accordance with the second optimal process parameter.

7. The method of claim 1, wherein said setting a third optimal process parameter comprises:

reading the third wafer information;

determining a third optimal process parameter by comparing and relating the read third wafer information to data of a pre-stored optimal process parameter table; and generating a control command and sending the control command to the developing unit in the spinner so that the developing unit performs a process in accordance with the third optimal process parameter.

8. The lithography system of claim 1, wherein the second wafer information includes the first wafer information and information denoting characteristics of processes carried out on the semiconductor wafer in the spinner.

9. The lithography system of claim 8, wherein the third wafer information includes the second wafer information and information denoting characteristics of processes carried out on the semiconductor wafer in the stepper.

* * * * *